Sept. 13, 1966 B. ROSS 3,273,029

METHOD OF ATTACHING LEADS TO A SEMICONDUCTOR BODY AND THE ARTICLE FORMED THEREBY

Filed Aug. 23, 1963

INVENTOR.
BERND ROSS
BY Lyon & Lyon
ATTORNEYS

United States Patent Office 3,273,029
Patented Sept. 13, 1966

3,273,029

METHOD OF ATTACHING LEADS TO A SEMICONDUCTOR BODY AND THE ARTICLE FORMED THEREBY

Bernd Ross, Arcadia, Calif., assignor to Hoffman Electronics Corporation, El Monte, Calif., a corporation of California Filed Aug. 23, 1963, Ser. No. 304,047
9 Claims. (Cl. 317—234)

This invention relates to semiconductor devices and more particularly relates to a method of attaching electrodes having a first expansion coefficient to a semiconductor body having a different expansion coefficient, and to the devices formed thereby.

In the assembly of semiconductor devices, it is frequently necessary to join materials of widely different physical characteristics. For example, in attaching the electrodes to a semiconductor diode, it is often desired to join a material such as silicon to metals such as copper or aluminum. However, since the ratios of the thermal coefficients of expansion of these materials are quite large (on the order of 10:1), severe stresses will result when appreciable areas of these materials are joined. The resulting strains may crack the semiconductor material or destroy some of its desirable electrical properties.

It has been established that the semiconductor properties of a material such as silicon do not suffer when the involved contacting areas remain sufficiently small. However, in the case of high power devices where the semiconductor wafers have diameters in the order of one quarter inch or more, large areas are necessarily involved because of the thermal and electrical conduction problems. These conflicting demands are presently met by the more or less makeshift solution of inserting plates of material such as molybdenum next to the semiconductor wafer. While molybdenum has a coefficient of thermal expansion close to that of silicon or germanium, it has relatively poor thermal and electrical conductivity characteristics and thus the device suffers in these areas.

According to the present invention, a semiconductor device is provided in which a copper or aluminum contact can be bonded directly to a semiconductor body. This is accomplished by forming the copper or aluminum contact in such a way that it has a large overall contacting area but in which the contacting area is divided into small individual segments, none of which are large enough to have deleterious effects on the semiconductor body as a result of thermal expansion. In this way, a high power device can be provided that has superior electrical and thermal characteristics than those heretofore obtainable.

It is therefore an object of the present invention to provide a semiconductor device having improved electrical and thermal conductivity characteristics.

It is also an object of the present invention to provide such a semiconductor device in which the semiconductor body and electrodes are bonded together in a manner which prevents their different thermal coefficients of expansion from damaging the semiconductor body.

It is another object of the present invention to provide such a semiconductor device in which the overall contact area of the electrodes is large but in which this area is divided into a plurality of small individual segments.

It is a further object of the present invention to provide a method of attaching electrodes of a metal having one expansion coefficient to a semiconductor body having a different expansion coefficient.

These and other objects and advantages of the present invention will become more apparent upon reference to the accompanying description and drawings in which.

Figure 1:
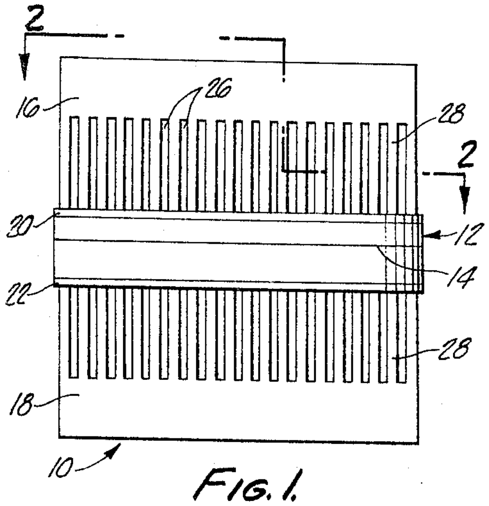
FIGURE 1 is a side elevation of a semiconductor device according to the one embodiment of the present invention.
Figure 2:
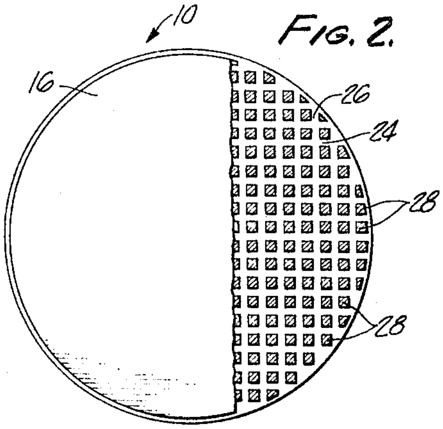
FIGURE 2 is a cross sectional view taken along lines 2—2 of FIGURE 1.
Figures 3, 4, 5, 6, 7:
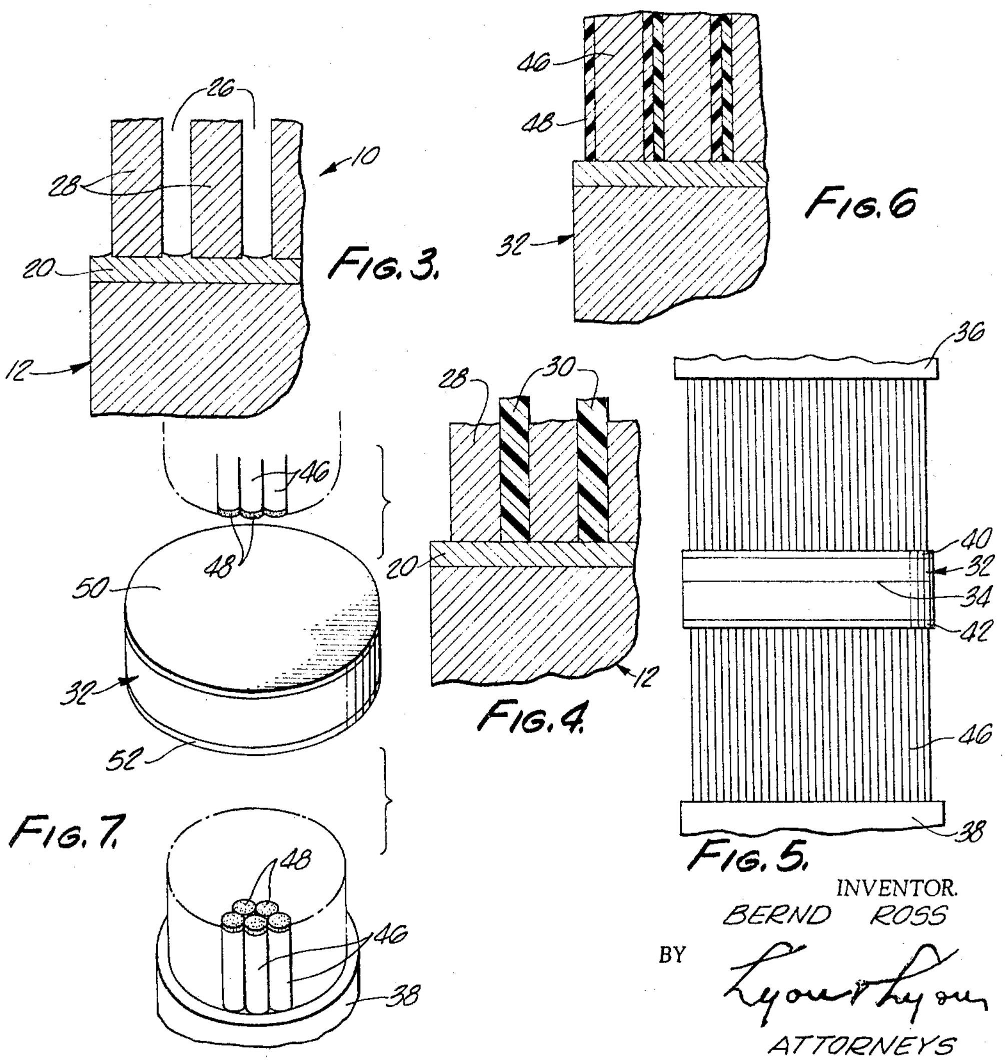
FIGURE 3 is an enlarged sectional detail of the semiconductor device of FIGURE 1.
FIGURE 4 is an enlarged sectional detail of a modification of the embodiment of FIGURE 3.
FIGURE 5 is a side elevation of a semiconductor device according to a second embodiment of the present invention.
FIGURE 6 is an enlarged sectional detail of this embodiment.
FIGURE 7 is an exploded perspective view of the semiconductor device of FIGURE 5.

Referring now to FIGURES 1 through 3, a semiconductor device, generally indicated at 10, includes a body or wafer 12 of a semiconductor material having a P-N junction 14 formed therein. The wafer 12 is provided with electrodes 16 and 18 for connection to an external circuit. The terminals 16 and 18 are bonded to the wafer 12 by thin layers of solder 20 and 22.

Each of the terminals 16 and 18 are solid blocks of a suitable material such as copper or aluminum in which are formed two sets of parallel channels or grooves, the grooves 24 of one set being perpendicular to the grooves 26 of the other set to form a plurality of parallel, slender elongated island 28. The grooves and islands give the base of the electrode a general appearance somewhat similar to that of a waffle iron grid as can be seen from FIGURE 2.

By forming the electrode in this manner, the contact area of each of the elongated island or conductors 28 can be kept below that at which damage to the semiconductor body will occur. The thickness of each of the islands relative to the depth of the grooves or channels surrounding it must be chosen with respect to the elastic modulus of the metal compared to the elastic modulus, the compressive strength and the shear strength of the semiconductor and the ratio of thickness to depth (or length of the island) should be kept as small as possible. The contact area and the thickness to length ratio chosen must, of course, take into consideration the thermal and electrical resistance of each island. By making the islands considerably longer than they are thick, the islands will deform along their length when the device heats up to absorb the thermal strain resulting from the expansion of the base of each of the blocks 16 and 18 without injuring the semiconductor material. The lateral expansion of the base and the longitudinal expansion of the islands will cause the latter to bow rather than move relative to the semiconductor surface.

In order to prevent the layer of solder 20 from deforming sufficiently to damage the semiconductor material, the layer must be kept quite thin, preferably thinner than the thickness of the islands 28. Because of solder's softness, such a thin layer will not deform sufficiently to injure the semiconductor body. The solder 20 must also be prevented from filling in the spaces between the elongated islands or conductors 28 by capillary action. If this occurs, a solid mass of metal is again formed that will expand laterally and damage the semiconductor material.

One way of preventing this from happening is, of course, to space the elongated islands or conductors 28 sufficiently far apart so that the effect of capillary attraction will be insignificant. A second manner in which this could be accomplished is to provide insufficient solder to fill the interstices between the elongated islands 28. This could be done, for example, by wetting only the ends of the the semiconductor body. So limiting the amount of solder utilized, however, may result in insufficient bonds being islands 28 with solder and then joining these islands with formed between the islands and the semiconductor body.

A third method of preventing the occurrence of capillary action is to coat at least the end portion of each of the individual islands or conductors 28 with a suitable inorganic or organic insulator, for example, a formaldehyde base varnish such as that sold commercially under the name "Formvar," that is not wettable by solder. After the coating step the ends of the islands or conductors 28 can be lapped to expose the conductive metal and then soldered to the semiconductor material.

A fourth method of preventing the occurrence of capillary action is shown in FIGURE 4. In this figure, the intersticies between the elongated conductors 28 are filled with a suitable insulating material such as polytetrafluroethylene, the material being generally indicated at 30 in this figure. These insulating spacers are preferably provided by forming a matrix of the insulating material, the matrix conforming to the face of the electrode and having a plurality of openings therein corresponding to the islands or elongated conductors 28. The matrix is slid over the formed end of the electrode until its bottom surface is flush with the ends of the islands 28. The matrix may be designed to fill the entire space between the islands 28 or only the lowermost portion thereof. After the matrix has been placed in position, the electrode can be soldered to the semiconductor body.

Referring now to FIGURES 5, 6 and 7, there is shown a second embodiment of the present invention. In this embodiment, a semiconductor body 32, for example, one having a P-N junction 34 therein, is connected to a pair of electrodes 36 and 38 by solder layers 40 and 42. In this embodiment, each of the electrodes 36 and 38 is formed of a bundle of wires 46, each of which is coated with a suitable insulating material such as mentioned previously. In the formation of these electrodes, each of the individual wires 46 is coated with the insulation 48 and are then bundled together in any suitable fashion. A transverse cut is then made across all of the wires, for example, by abrasive sawing, and the resulting exposed ends are then lapped to smooth and even them off. The exposed conductive material is then tinned and soldered to the semiconductor body 32. The semiconductor body is preferably provided with thin layers of solder 50 and 52 on either side to insure a better bond. The soldering is preferably done in a fluxless manner as in a conventional furnace. If aluminum wires were used, the individual wires could be anodized and the soldering done ultrasonically.

An electrode formed in this latter manner provides an extreme case of the dimensional conditions set out above. Typical wires to be used in the formation of such an electrode would have a diameter of ten mils and the thickness of the insulation would be about one mil. Since the length of the wires can be made any desired value, the surface contact area segments are extremely small as is the thickness to length ratio.

From the foregoing description, it can be seen that a semiconductor device has been provided which has good thermal and electrical conductivity characteristics and yet is not subject to damage as a result of differential expansion of the various materials. Such devices are therefore of great utility in high power applications where all of these characteristics are extremely desirable. While the invention has been described and illustrated in connection with a semiconductor diode, it should be obvious that the teachings of the invention are applicable to any other semiconductor device and such devices are intended to be included in the appended claims.

I claim:

1. A semiconductor device comprising a body of semiconductor material, a pair of electrodes, at least one of said electrodes including a block of electrically conductive material having a coefficient of thermal expansion substantially greater than said semiconductor material, one end of said block having first and second sets of deep channels formed therein, said first set being perpendicular to said second set whereby a plurality of generally parallel, substantially wire-shaped conductors extend from the other end of said block, a layer of solder bonding the ends of said conductors directly to said body, said conductors being sufficiently long relative to their thickness so that heating of said conductors causes them to bow and reduce stress on said body caused by the difference in the coefficients of thermal expansion of said semiconductor material and said conductive material.

2. The device of claim 1 wherein at least a portion of each of said conductors adjacent the outer end thereof is covered by an insulating material.

3. The device of claim 2 wherein said insulating material is a portion of a matrix which conforms to the formed end of said block.

4. The device of claim 2 wherein said insulating material is non-wettable by said bonding material and is coated onto said conductors.

5. A semiconductor device comprising a body of semiconductor material, a pair of electrodes, at least one of said electrodes including a plurality of elongated, insulated wires of a conductive material having a coefficient of thermal expansion substantially greater than said semiconductor material, and a layer of solder bonding the ends of said wires directly to said body, said ends of said wires making small area connections with said semiconductor body so that when said device is heated the stress on said body caused by the difference in the coefficients of thermal expansion of said semiconductor material and said conductive material is reduced.

6. The device of claim 5 wherein the material insulating said wires is non-wettable by solder.

7. A process of constructing a semiconductor device comprising coating each of a plurality of conductive wires with an insulating material non-wettable by solder, assembling said insulated wires into a bundle, making a transverse cut through said bundled wires to expose a conductive surface of each wire and soldering said surfaces directly to a body of semiconductor material.

8. A process of constructing a semiconductor device comprising forming a plurality of deep channels in one end of a block of conductive material to leave a plurality of generally parallel, elongated conductors, coating at least a portion of each of said elongated conductors with an insulating material non-wettable by solder, and soldering the ends of said conductors directly to a body of semiconductor material.

9. A process of constructing a semiconductor device comprising forming a plurality of deep channels in one end of a block of conductive material to leave a plurality of generally parallel, elongated conductors, telescoping a matrix of insulating material having a plurality of generally parallel apertures extending therethrough corresponding to said conductors and having a thickness no greater than the length of said conductors over said formed end with said conductors being inserted into said apertures, and soldering the ends of said conductors directly to a body of semiconductor material.

(References on following page)

References Cited by the Examiner

UNITED STATES PATENTS

| | | | |
|---|---|---|---|
| 2,608,722 | 9/1952 | Stuetzer | 317—235 |
| 2,758,263 | 8/1956 | Robilliard | 317—235 |
| 2,778,980 | 1/1957 | Hall | 29—25.3 X |
| 2,794,942 | 6/1957 | Cooper | 317—235 |
| 2,849,665 | 8/1958 | Boyer et al. | 29—155.5 |
| 2,906,930 | 9/1959 | Raithel | 317—234 |
| 3,080,640 | 3/1963 | Jochems | 29—155.5 |
| 3,114,865 | 12/1963 | Thomas | 317—234 |
| 3,128,419 | 4/1964 | Waldkotter | 317—234 |
| 3,153,581 | 10/1964 | Hutchins | 29—194 |
| 3,226,269 | 12/1965 | Allegretti et al. | 148—33.5 |

FOREIGN PATENTS

| | | |
|---|---|---|
| 1,314,819 | 12/1962 | France. |

JOHN W. HUCKERT, *Primary Examiner.*

A. M. LESNIAK, *Assistant Examiner.*